United States Patent
Liu et al.

(10) Patent No.: US 11,699,707 B2
(45) Date of Patent: Jul. 11, 2023

(54) ARRAY SUBSTRATE, DISPLAY PANEL AND MANUFACTURING METHOD THEREOF

(71) Applicant: BOE TECHNOLOGY GROUP CO., LTD., Beijing (CN)

(72) Inventors: Chao Liu, Beijing (CN); Yujun Zhang, Beijing (CN); Jing Yu, Beijing (CN); Julong Feng, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 277 days.

(21) Appl. No.: 16/400,607

(22) Filed: May 1, 2019

(65) Prior Publication Data
US 2020/0043948 A1   Feb. 6, 2020

(30) Foreign Application Priority Data
Aug. 1, 2018 (CN) .......................... 201810862771.X

(51) Int. Cl.
*H01L 27/12* (2006.01)
*G02F 1/1362* (2006.01)
*H10K 59/131* (2023.01)

(52) U.S. Cl.
CPC ...... *H01L 27/124* (2013.01); *G02F 1/136286* (2013.01); *H01L 27/1262* (2013.01); *H10K 59/131* (2023.02)

(58) Field of Classification Search
CPC ............... H01L 27/124; H01L 27/1262; H01L 27/3276; H01L 27/1218; H01L 27/153; H01L 27/156; H01L 33/62; G02F 1/136286; G02F 1/1345; G02F 1/134309; G02F 1/13452; G02F 1/136
See application file for complete search history.

(56) References Cited

U.S. PATENT DOCUMENTS

| 9,959,824 B2 | 5/2018 | Lee et al. |
| 10,371,996 B2 | 8/2019 | Guan et al. |
| 2019/0101782 A1 | 4/2019 | Cao et al. |
| 2019/0252585 A1* | 8/2019 | Hsieh .................. H01L 25/0753 |
| 2022/0020779 A1* | 1/2022 | Wei ........................ G06F 3/0412 |

FOREIGN PATENT DOCUMENTS

| CN | 105511181 A | 4/2016 |
| CN | 106950763 A | 7/2017 |
| CN | 107741677 A | 2/2018 |
| CN | 108389868 A | 8/2018 |
| JP | 4882284 B2 * | 2/2012 |
| JP | 2015175969 A | 10/2015 |
| JP | 2016146439 A | 8/2016 |

OTHER PUBLICATIONS

Chinese Office Action in Chinese Application No. 201810862771.X dated Nov. 2, 2020 with English translation.

* cited by examiner

*Primary Examiner* — Hoang-Quan Ho
(74) *Attorney, Agent, or Firm* — Collard & Roe, P.C.

(57) ABSTRACT

An array substrate, a display panel and a manufacturing method thereof are provided. The array substrate includes a base substrate including a peripheral region; and a lead region located in the peripheral region, the lead region including a plurality of leads, wherein a main plane of the base substrate provided with the plurality of leads includes a first side edge, and the plurality of leads extend to the first side edge, a lateral surface of the base substrate at the first side edge is provided with a concave portion, and an electrode electrically connected with the plurality of leads is disposed in the concave portion.

17 Claims, 4 Drawing Sheets

ARRAY SUBSTRATE, DISPLAY PANEL AND MANUFACTURING METHOD THEREOF

This application claims priority to Chinese Patent Application No. 201810862771.X, filed on Aug. 1 2018, and the entire disclosure of which is incorporated herein by reference as a part of this application.

TECHNICAL FIELD

At least one embodiment of the present disclosure relates to an array substrate, a display panel and a manufacturing method thereof.

BACKGROUND

At present, ultra-thin, ultra-narrow frame and even frameless display devices are attracting more and more attention, so many manufacturers are developing towards making ultra-narrow and even frameless display devices.

SUMMARY

At least one embodiment of the present disclosure provides an array substrate, a display panel and a manufacturing method thereof.

At least one embodiment of the present disclosure provides an array substrate including: a base substrate including a peripheral region; and a lead region located in the peripheral region. The lead region includes a plurality of leads. A main plane of the base substrate provided with the plurality of leads includes a first side edge, and the plurality of leads extend to the first side edge, a lateral surface of the base substrate at the first side edge is provided with a concave portion, and an electrode electrically connected with the plurality of leads is disposed in the concave portion.

In some examples, in a first direction parallel to the main plane and perpendicular to the first side edge, the size of the concave portion is 1-10 microns.

In some examples, in a second direction perpendicular to the main plane, the concave portion penetrates the base substrate to form a notch at the first side edge.

In some examples, in a first direction parallel to the main plane and perpendicular to the first side edge, a size of the electrode is not greater than a size of the concave portion.

In some examples, in a second direction perpendicular to the main plane, a size of the concave portion is smaller than a size of the base substrate.

In some examples, in the second direction, the concave portion extends to the main plane of the base substrate on which the plurality of leads are provided to form a notch at the first side edge.

In some examples, in a first direction parallel to the main plane and perpendicular to the first side edge, a size of the electrode is not smaller than the size of the concave portion.

In some examples, the concave portion includes a plurality of sub-concave portions separated from each other, the plurality of sub-concave portions are disposed in one-to-one correspondence with the plurality of leads, and the electrode in each of the sub-concave portions is electrically connected to each of the plurality of leads.

In some examples, the concave portion is one integral concave, and the electrode in the concave portion includes a plurality of sub-electrodes, and each of the sub-electrodes being electrically connected to each of the plurality of leads.

In some examples, in the first direction, a size of the lead region is 0.07-0.7 mm.

In some examples, the electrode includes a portion located within the concave portion and another portion located on a surface of the base substrate away from the main plane on which the plurality of leads are located.

At least one embodiment of the present disclosure provides a display panel including: the array substrate of any one of the above examples; and an opposing substrate disposed opposite to the array substrate and positioned on a side of the array substrate provided with the lead region.

In some examples, the display panel further includes a circuit board disposed on a surface of the base substrate away from the opposing substrate or the lateral surface, and electrically connected to the plurality of leads through the electrode.

In some examples, in a second direction perpendicular to the main plane, a portion of the lateral surface of the base substrate at the first side edge other than the concave portion is located on a same plane as a lateral surface of the opposing substrate.

At least one embodiment of the present disclosure provides a manufacturing method for a display panel, including: forming an array substrate, wherein the array substrate includes a peripheral region, the peripheral region includes a lead region, a plurality of leads are formed in the lead region, and a main plane of the array substrate provided with the plurality of leads includes a first side edge, and the plurality of leads extend to the first side edge; providing an opposing substrate; cell assembling the opposing substrate and the array substrate with a side of the array substrate provided with the lead region facing the opposing substrate; forming a concave portion in a lateral surface of the array substrate at the first side edge; and forming an electrode electrically connected to the plurality of leads in the concave portion.

In some examples, the manufacturing method further includes: disposing a circuit board on a surface of the array substrate away from the opposing substrate or the lateral surface; and electrically connecting the circuit board with the plurality of leads through the electrode.

In some examples, forming the array substrate includes forming an array substrate motherboard; providing the opposing substrate includes providing an opposing substrate motherboard; cell assembling the opposing substrate and the side of the array substrate provided with the lead region includes: cell assembling the opposing substrate motherboard and the array substrate motherboard, and cutting the array substrate motherboard and the opposing substrate motherboard to form the array substrate and the opposing substrate, so that the first side edge is flush with a second side edge of the opposing substrate in a direction perpendicular to the main plane of the array substrate.

BRIEF DESCRIPTION OF THE DRAWINGS

In order to clearly illustrate the technical solution of embodiments of the present disclosure, the drawings of the embodiments will be briefly described in the following, it is obvious that the drawings in the description are only related to some embodiments of the present disclosure and not limited to the present disclosure.

DETAILED DESCRIPTION

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects.

Figure 1:
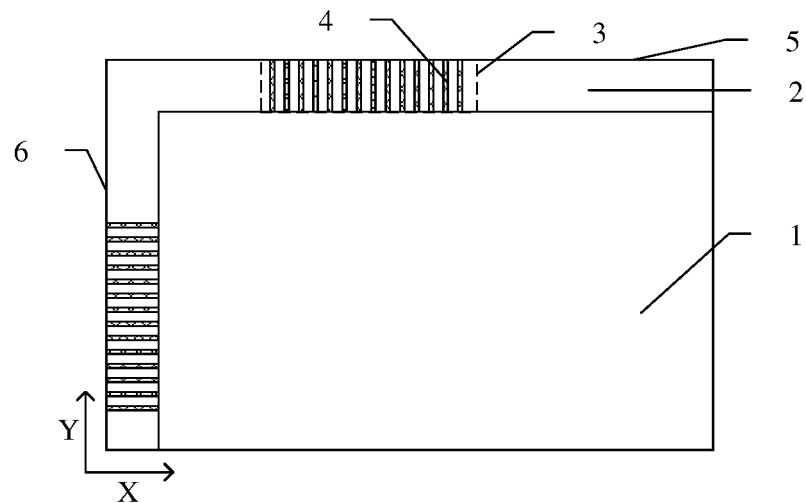
FIG. 1 is a schematic view of a partial planar structure of an array substrate.

FIG. 1 is a schematic view of a partial planar structure of an array substrate. As shown in FIG. 1, the array substrate includes a display region 1 and a peripheral region 2 surrounding the display region 1. The peripheral region 2 includes a bonding region 3 in which a plurality of leads 4 are disposed to realize bonding with circuit boards such as a flexible printed circuit board or a chip on film. For example, as shown in FIG. 1, the peripheral region of the array substrate can include two bonding regions respectively located near a side edge 5 extending in an X direction and near a side edge 6 extending in a Y direction, and the two bonding regions are respectively used for bonding with a data driving chip and a scan driving chip, which is not limited thereto. The peripheral region of the array substrate can also include more bonding regions. The bonding region 3 located near the side edge 5 extending in the X direction is taken as an example for description, the bonding region 3 has a size in the Y direction of at least 1-2 mm Thus, the array substrate shown in FIG. 1 is difficult to meet the requirements of ultra-narrow display screens for narrow frame.

In order to realize the design of the ultra-narrow frame, a silver glue electrode can be disposed on a lateral surface perpendicular to an XY plane on which the side 5 of the array substrate is located, and the silver glue electrode is electrically connected with the leads 4 located on a front surface of the array substrate (the surface shown in FIG. 1 is the front surface), so that the bonding region 3 originally located on the front surface of the array substrate is transferred to the lateral surface in which the side 5 of the array substrate is located or a back surface of the array substrate, thereby reducing a width of the frame to realize the design of the ultra-narrow frame at periphery. However, the inventors of the present application have found that during an assembly process of the array substrate, a manner of directly disposing the silver glue electrode on the lateral surface of the array substrate may cause the silver glue electrode located on the lateral surface of the array substrate to be easily broken because of damage.

At least one embodiment of the present disclosure provides an array substrate, a display panel and a manufacturing method thereof. The array substrate includes a base substrate including a peripheral region; and a lead region located in the peripheral region. The lead region includes a plurality of leads. A main plane of the base substrate provided with the leads includes a first side edge, and the leads extend to the first side edge, a lateral surface including the first side edge is provided with a concave portion, and an electrode electrically connected with the leads is disposed in the concave portion. The lateral surface in which the first side edge is located of the array substrate provided by the present disclosure is provided with a concave portion, and the electrode in the concave portion is electrically connected with the leads, so that the design of a ultra-narrow frame at periphery can be realized, and the concave portion can protect the electrode to prevent the electrode on the lateral surface of the array substrate from being broken because of damage. In addition, the preparation method for forming the concave portion on the lateral surface of the array substrate is simple and easy to realize.

The array substrate, the display panel and the manufacturing method thereof provided by the embodiment of the present disclosure will be described below with reference to the accompanying drawings.

Figure 2A:
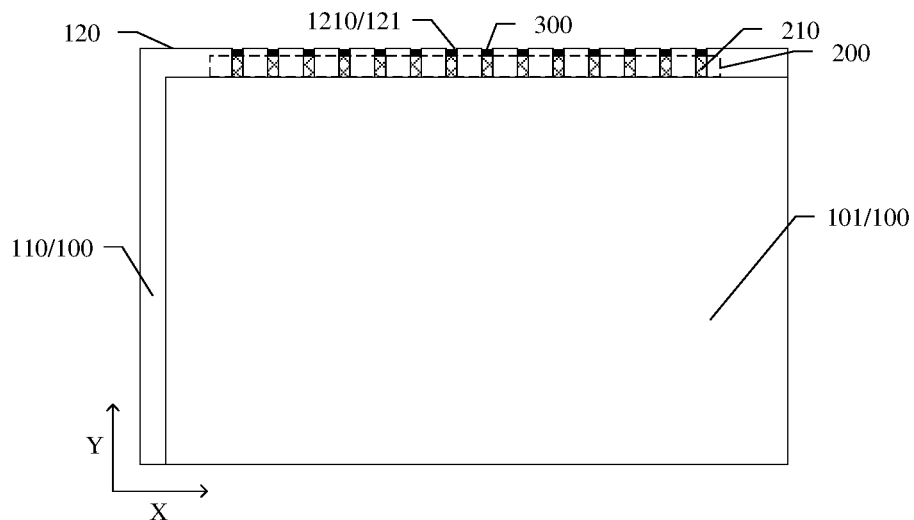
FIG. 2A is a schematic view of a partial front structure of an array substrate provided by an embodiment of the present disclosure.
Figure 2B:
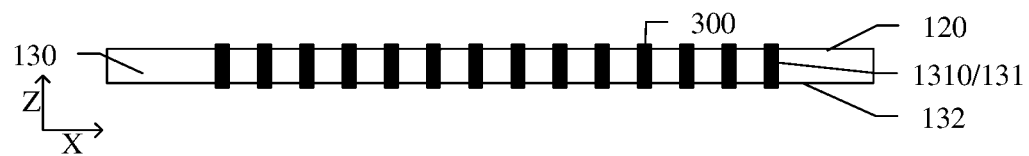
FIG. 2B is a lateral surface view of the array substrate shown in FIG. 2A.

FIG. 2A is a schematic view of a partial front structure of an array substrate according to an embodiment of the present disclosure, and FIG. 2B is a schematic side view of the array substrate shown in FIG. 2A. As shown in FIG. 2A and FIG. 2B, the present embodiment provides an array substrate including a base substrate 100. The base substrate includes a display region 101 and a peripheral region 110 located around the display region 101. The present embodiment is described by taking a case that a surface of the base substrate 100 shown in FIG. 2A provided with the display region 101 and the peripheral region 110 is a front surface. FIG. 2A schematically shows a part of the display region and a part of the peripheral region around two adjacent sides of the display region. As shown in FIG. 2A and FIG. 2B, the array substrate further includes a lead region 200 located in the peripheral region 110. The lead region 200 includes a plurality of leads 210, and the leads 210 can be data lines or scanning lines on the array substrate, or wires (e.g., fan wires) connecting the data lines or scanning lines to the driving chip.

As shown in FIG. 2A and FIG. 2B, the main plane of the base substrate 100 provided with the leads 210 includes a first side edge 120, the lateral surface 130 in which the first side edge 120 is located is provided with a concave portion 131, and an electrode 300 electrically connected to the leads 210 is provided in the concave portion 131.

On the one hand, the present embodiment transfers a bonding region of the array substrate bonded to the circuit board to the lateral surface or a back surface of the array substrate to realize the design of an ultra-narrow frame at periphery by disposing the concave portion on the lateral surface in which the first side edge of the array substrate is located and electrically connecting the electrode disposed in the concave portion with the leads; on the other hand, because the concave portion can protect the electrode to prevent the electrode located in the lateral surface of the array substrate from being broken because of damage. In addition, the preparation method for forming the concave portion at the lateral surface of the array substrate is simple and easy to realize.

The above-mentioned main plane refers to a plane parallel to the XY surface, and the plane includes four side edges, and one of the plurality of leads extends to one of the four side edges in a certain direction, and the side edge is the first side edge. The lateral surface including the first side may be, for example, a surface perpendicular to the main plane, and the lateral surface is connected to the main plane through the first side edge.

It should be noted that only one lead region is illustrated on the array substrate. In actual process, the array substrate may include two lead regions (the case shown in FIG. 1) to realize single-sided driving, or the array substrate may also include four lead regions distributed around the display region to realize double-sided driving. The present embodiment is not limited thereto. Thus, the array substrate includes at least one first side edge. The present embodiment is described by taking a case that the first side edge 120 is one side edge extending in the X direction as shown in FIG. 2A.

For example, as shown in FIG. 2A and FIG. 2B, in an example of the present embodiment, the lead 210 extends to the first side edge 120, and the concave portion 131 provided on the lateral surface 130 including the first side edge 120 extends at least to the main plane of the base substrate 100 on which the lead 210 is provided to form a notch 121 at the first side edge 120.

For example, as shown in FIG. 2A and FIG. 2B, the main plane of the base substrate 100 on which the leads 210 are disposed is the first surface (i.e., the front surface), and a surface of the base substrate 100 opposite the first surface is a second surface (i.e., the back surface). The notch 121 provided on the first side edge 120 of the first surface can extend toward the second surface, thereby forming the concave portion 131 including the notch 121 at the lateral surface 130 connecting the first surface and the second surface.

For example, the notch 121 provided at the first side edge 120 of the first surface can extend toward the second surface in a direction perpendicular to the first surface (i.e., in a Z direction) to form the concave portion 131 shown in FIG. 2B. The present embodiment includes but is not limited thereto, the notch may also extend from the first surface to the second surface in other directions to form the concave portion on the lateral surface.

For example, as shown in FIG. 2A and FIG. 2B, in a first direction parallel to the main plane and perpendicular to the first side edge 120, i.e., the Y direction, a size of the concave portion 131 is 1-10 microns. That is, in the Y direction, a size of the notch 121 is 1-10 microns. Compared with a case shown in FIG. 1 that a size of the bonding region in the Y direction is designed to be 1-2 mm, the array substrate provided by the present embodiment can transfer the bonding region to the lateral surface or the back surface of the array substrate through the arrangement of the concave portion and the electrode in the concave portion to reduce the width of the frame.

For example, as shown in FIG. 2A and FIG. 2B, a size of a frame region including the lead region 200 in the Y direction may be 0.07-0.7 mm. For example, the size of the frame region in which the lead region 200 is located in the Y direction may be 0.3-0.5 mm.

For example, in an example of the present embodiment, as shown in FIG. 2A and FIG. 2B, in the Y direction, the size of the electrode 300 is not greater than the size of the concave portion 131, that is, in the Y direction, the electrode 300 may not fill the concave portion 131 or may just fill the concave portion 131, but the electrode 300 does not protrude with respect to a portion of the lateral surface 130 where the concave portion 131 is not provided. Therefore, in a case that the array substrate is subjected to a subsequent assembly process, the concave portion can protect the electrode from being damaged, thereby ensuring the electrical connection effect between the array substrate and the circuit board.

For example, as shown in FIG. 2A and FIG. 2B, in a second direction perpendicular to the main plane of the base substrate 100, i.e., the Z direction, the concave portion 131 penetrates the base substrate 100, i.e., the concave portion 131 extends from the first surface of the base substrate 100 to the second surface to also form a notch at the third side edge 132 of the second surface opposite to the first side edge 120. That is, the lateral surface 130 includes the first side edge 120 located in the first surface and the third side edge 132 located in the second surface extending in the X direction, and the concave portion 131 penetrates through the base substrate to form a notch in both the first surface and the second surface.

For example, as shown in FIG. 2A and FIG. 2B, the concave portion 131 can extend in the Z direction. The present embodiment is not limited thereto, the concave portion can also extend in other directions as long as the concave portion penetrates through the base substrate.

For example, as shown in FIG. 2A and FIG. 2B, the size of the electrode 300 is not smaller than the size of the concave portion 131 in the Z direction so that the lead 210 located on the first surface of the base substrate 100 can be electrically connected with the electrode 300.

For example, in the Z direction, the size of the electrode 300 is not smaller than the size of the base substrate 100.

Figure 2C:
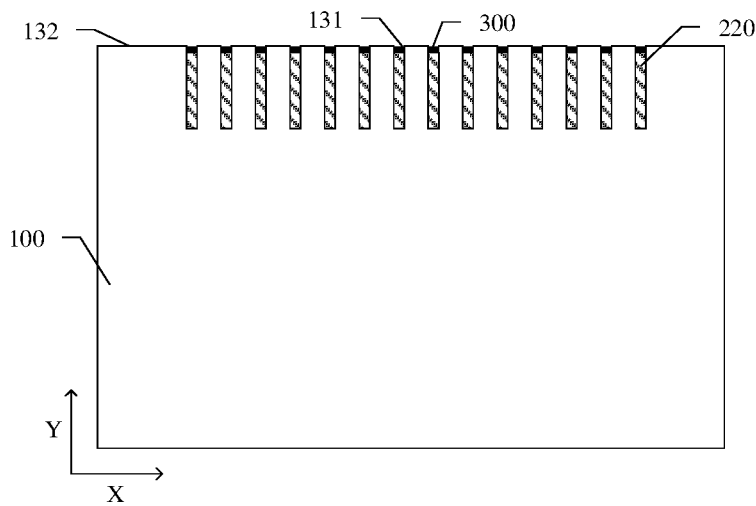
FIG. 2C is a schematic view of a surface opposite to a front surface of the array substrate shown in FIG. 2A.

For example, FIG. 2C is a schematic view of a surface opposite to the plane of the array substrate shown in FIG. 2A. The surface of the base substrate 100 with the lead region 200 shown in FIG. 2A is the first surface (i.e., the front surface), the surface shown in FIG. 2C is the second surface (i.e., the back surface) of the base substrate opposite to the first surface, and the second surface includes the third side edge 132 corresponding to the first side edge. FIG. 2C shows a case that the concave portion penetrates through the base substrate.

For example, as shown in FIG. 2C, in an example of the present embodiment, the second surface of the base substrate may be provided with a back electrode 220 electrically connected to the electrode 300, and the back electrode 220 is electrically connected to a lead located at the first surface of the base substrate through the electrode 300. In a case that the size of the electrode 300 is not smaller than the size of the concave portion 131 in the Z direction, the electrode 300 can be more conveniently electrically connected to the back electrode 220.

For example, the present example is not limited to the same electrode in which the back electrode 220 and the electrode 300 are integrated or different electrodes made separately, as long as the back electrode 220 and the lead 210 can be electrically connected.

For example, as shown in FIG. 2C, the bonding region of the array substrate can be a region in which the back electrode 220 is located, that is, a bonding process of the array substrate is performed on the second surface thereof its base substrate. Thus, a circuit board such as a flexible printed circuit board or a chip on film can be electrically connected to the back electrode 220 to realize bonding. In this example, the bonding region of the array substrate bonded to the circuit board is transferred to the back surface of the array substrate, so that the design of an ultra-narrow frame at periphery can be realized.

For example, in another example of the present embodiment, the circuit board such as a flexible printed circuit board or a chip on film can be directly electrically connected to the electrode 300 shown in FIG. 2B to realize bonding, that is, the bonding region of the array substrate can be the lateral surface of the array substrate on which the electrode 300 is located, thereby transferring the bonding region of the array substrate bonded to the circuit board to the lateral surface of the array substrate to realize the design of an ultra-narrow frame at periphery. In a case that the bonding region of the array substrate bonded to the circuit board is located on the lateral surface of the array substrate, the size of the electrode 300 may be slightly greater (not more than 1 micron, for example, may be several thousand angstroms) than the size of the concave portion 131 in the Y direction so that a bonding electrode in the bonding region of the circuit board can be more easily electrically connected to the electrode 300. In this case, even if the electrode 300 is damaged, it is not easy to fracture.

Figure 3A:
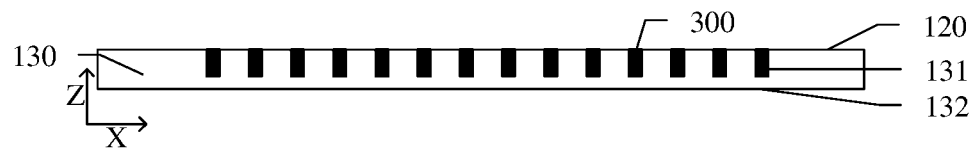
FIG. 3A is a lateral surface view of an array substrate provided by another embodiment of the present disclosure.

For example, FIG. 3A is a lateral surface view of an array substrate according to another embodiment of the present disclosure. As shown in FIG. 3A, in an example of the present embodiment, the size of the concave portion 131 is smaller than that of the base substrate in a second direction perpendicular to the main plane of the base substrate, i.e., the Z direction. The concave portion 131 does not penetrate through the base substrate. For example, in the Z direction, the concave portion 131 penetrates only the main plane of the base substrate provided with the leads 210 to form a notch at the first side edge 120, that is, the second surface of the base substrate includes no notch on the third side edge 132 opposite to the first side edge 120.

For example, as shown in FIG. 3A, in a case that the concave portion 131 does not penetrate through the base substrate, the electrode 300 located in the concave portion 131 does not extend to the second surface of the base substrate. In this case, the bonding region of the array substrate is only the lateral surface on which the electrode 300 is located, i.e., the bonding electrode on the circuit board such as a flexible printed circuit board or a chip on film is directly electrically connected with the electrode 300 shown in FIG. 3A to realize bonding, thereby transferring the bonding region of the array substrate bonded to the circuit board to the lateral surface of the array substrate to realize the design of the ultra-narrow frame at periphery.

Figure 3B:
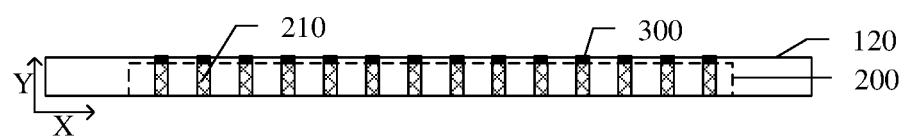
FIG. 3B is a schematic view of a partial front structure of the array substrate shown in FIG. 3A.

For example, FIG. 3B is a schematic view of a partial front structure of the array substrate shown in FIG. 3A. As shown in FIG. 3A and FIG. 3B, in the first direction (i.e., Y direction) parallel to the main plane and perpendicular to the first side edge 120, the size of the electrode 300 is not smaller than the size of the concave portion 131. For example, in the first direction, the size of the electrode 300 is greater than the size of the concave portion 131, that is, the electrode 300 protrudes away from a center of the base substrate with respect to the lateral surface 130 including the first side edge 120 so that the circuit board can be electrically connected with the electrode 300. In the present embodiment, the size of the electrode 300 is slightly greater than the size of the concave portion 131 in the Y direction, that is, the size of the electrode 300 is no more than 1 micron greater than the size of the concave portion 131 in the Y direction, for example, the size of the electrode 300 may be several thousand angstroms greater than the size of the concave portion 131.

For example, as shown in FIG. 3B, the size of the electrode 300 located in the concave portion 131 in the Y direction may be 2-4 microns.

For example, a material of the electrode 300 may be nano silver glue or a conductive film material, and the present embodiment is not limited thereto.

Figure 3C:
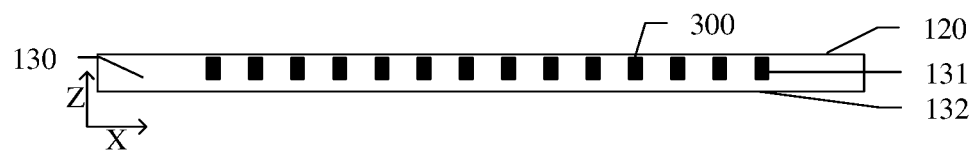
FIG. 3C is a lateral surface view of an array substrate provided by another example of another embodiment of the present disclosure.

The present embodiment is not limited thereto. For example, the concave portion 131 may not penetrate through the main plane of the base substrate or the surface opposite to the main plane. As shown in FIG. 3C, a distance between the concave portion 131 and the first side edge 120, and a distance between the concave portion 131 and the third side edge 132 are both greater than zero in the Z direction. In this case, the electrode 300 disposed in the concave portion 131 shown in FIG. 3C functions as the electrode shown in FIG. 3B, thereby transferring the bonding region of the array substrate bonded to the circuit board to the lateral surface of the array substrate to realize the design of an ultra-narrow frame at periphery.

For example, FIG. 2A to FIG. 3C are described with the notch 121 including a plurality of sub-notches 1210 as an example, that is, the concave portion 131 includes a plurality of sub-concave portions 1310. The plurality of sub-notches 1210 are disposed one-to-one corresponding to the plurality of leads 210, that is, each lead 210 extends to one sub-notch 1210, and the electrode 300 in each sub-concave portion 1310 is electrically connected to each lead 210. The electrodes 300 electrically connected to the plurality of leads 210 are disposed in a plurality of independent (separated from each other) sub-concave portions 1310, so that the electrodes 300 located in adjacent sub-concave portions 1310 can be insulated from each other.

For example, the size of each sub-notch 1210 in the X direction may be 30-60 microns.

For example, in the X direction, a spacing between adjacent sub-notches 1210 may be 30-60 microns.

Figure 4A:
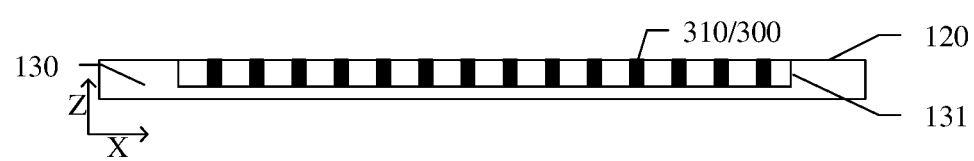
FIG. 4A is a lateral surface view of an array substrate provided by another example of another embodiment of the present disclosure.
Figure 4B:
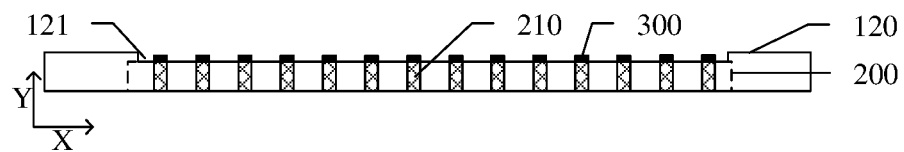
FIG. 4B is a schematic view of a front structure of the array substrate shown in FIG. 4A.

For example, FIG. 4A is a partial latera side view of the array substrate provided by another example of the present embodiment, and FIG. 4B is a front structural view of the array substrate shown in FIG. 4A. As shown in FIG. 4A and FIG. 4B, the first side edge 120 of the array substrate provided in this example includes a notch 121, that is, the lateral surface 130 of the array substrate includes a concave portion 131. The notch 121 is disposed corresponding to a plurality of leads 210, that is, all leads 210 extend to the notch 121.

For example, as shown in FIG. 4A and FIG. 4B, the electrode 300 in one integral concave portion 131 includes a plurality of sub-electrodes 310, the plurality of sub-electrodes 310 correspond to the plurality of leads 210 one by one, each sub-electrode 310 is electrically connected to each lead 210, and the plurality of sub-electrodes 310 are insulated from each other.

Figure 5:
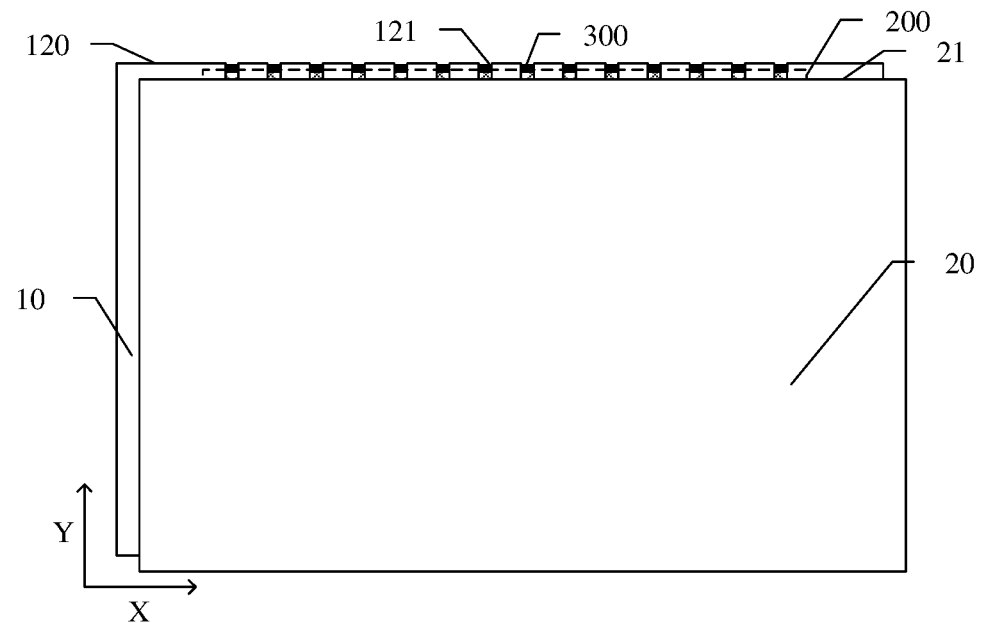
FIG. 5 is a partial structural view of a display panel provided by another embodiment of the present disclosure.

For example, FIG. 5 is a partial structural view of a display panel provided by another embodiment of the present disclosure. As shown in FIG. 5, the display panel includes an array substrate 10, which is the array substrate provided in any of the above embodiments. The display panel further includes an opposing substrate 20 disposed opposite to the array substrate 10, and the opposing substrate 20 is located on a side of the array substrate 10 on which the lead region 200 is disposed. And a portion of the first side edge 120 on which the notch 121 is not provided is flush with a second lateral surface 21 of the opposing substrate 20 in a direction perpendicular to the main plane (i.e., the XY surface) of the base substrate included in the array substrate 10. In the FIG. 5, the array substrate and the opposing substrate are shown staggered. In fact, the part of the first side edge of the array substrate that is not provided with a notch is flush with the second side edge of the opposing substrate, that is, the lateral surface including the part of the first side edge of the array substrate other than the notch is in the same plane as the lateral surface including the second side edge of the opposing substrate.

In the present embodiment, the bonding region of the array substrate 10 bonded to the circuit board is transferred to the lateral surface or the back surface of the array substrate 10, so that the size of the opposing substrate 20 in the Y direction can be the same as the size of the array substrate 10 in the Y direction, i.e., there is no need to reserve a bonding region in the surface of the array substrate 10 facing the opposing substrate 20, thus realizing the design of an ultra-narrow frame at periphery.

For example, the opposing substrate 20 can be a color film substrate. In this case, a liquid crystal layer is also provided between the array substrate and the color film substrate. The display panel is a liquid crystal display panel. The present embodiment is not limited thereto, and the opposing substrate can also be a cover glass, and the display panel can be an organic light emitting diode display panel.

Figure 6:
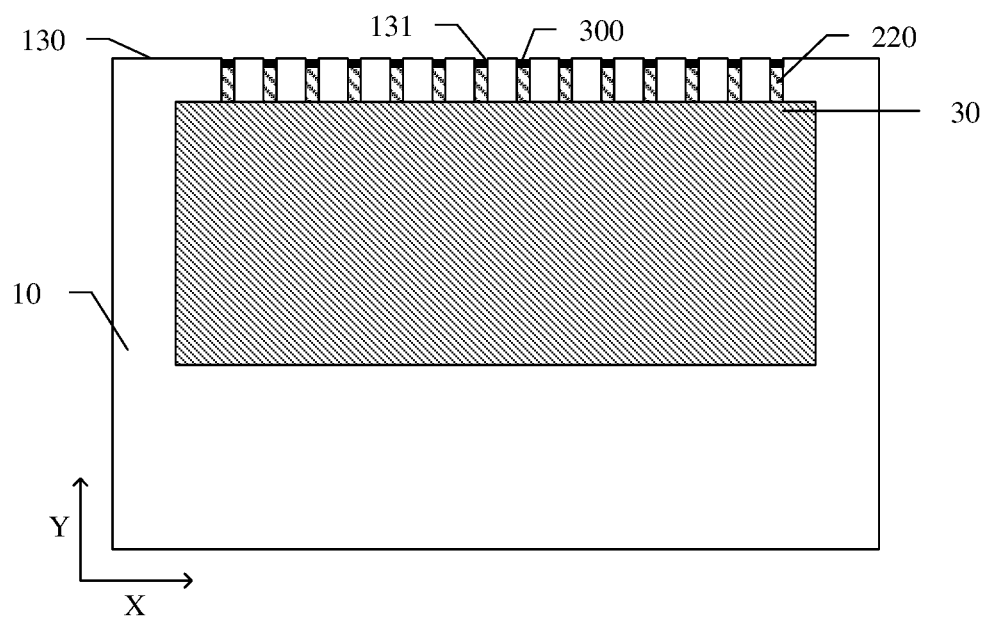
FIG. 6 is a schematic view of a surface of an array substrate included in a display panel shown in an example of another embodiment of the present disclosure, which is away from an opposing substrate.

For example, FIG. 6 is a schematic view of a surface of an array substrate included in a display panel shown in an example of the present embodiment away from an opposing substrate. As shown in FIG. 6, a back electrode 220 electrically connected to the electrode 300 is provided on a side of the array substrate 10 away from the opposing substrate. For example, the present example is not limited to the same electrode in which the back electrode 220 and the electrode 300 are integrated, or different electrodes made separately, as long as the back electrode 220 and the leads in the lead region can be electrically connected.

For example, as shown in FIG. 6, the display panel further includes a circuit board 30 disposed on a surface of the base substrate opposite to the main plane (i.e., the second surface of the base substrate, a surface of the base substrate away from the opposing substrate). The circuit board 30 is provided with a plurality of bonding electrodes (not shown in the FIG. 6), and the plurality of bonding electrodes are respectively electrically connected with the plurality of back electrodes 220 to realize electrical connection with the leads of the lead regions. Therefore, in the present example, the bonding region of the circuit board 30 and the array substrate 10 is located on the side of the array substrate 10 away from the opposing substrate. The bonding region is located on the opposite side of the array substrate 10 on which the display region is provided, that is, the back surface of the array substrate 10. In the present example, the bonding region of the array substrate 10 bonded to the circuit board 30 is transferred to the back surface of the array substrate 10, thereby realizing the design of an ultra-narrow frame at periphery.

Figure 7:
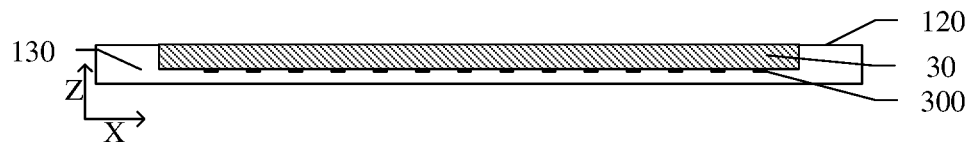
FIG. 7 is a lateral surface view of a display panel provided by another example of another embodiment of the present disclosure.

For example, FIG. 7 is a schematic view of a lateral surface of a display panel shown in another example of the embodiment. As shown in FIG. 7, the display panel further includes a circuit board 30 disposed on a lateral surface 130 of the array substrate 10. A plurality of bonding electrodes (not shown in the FIG. 7) are disposed on the circuit board 30, and the plurality of bonding electrodes are directly electrically connected with the electrode 300 to realize bonding, that is, the bonding region of the array substrate 10 can be the lateral surface on which the electrode 300 is located, so that the bonding region of the array substrate 10 bonded to the circuit board 30 is transferred to the lateral surface of the array substrate 10 to realize the design of an ultra-narrow frame at periphery.

Figure 8:
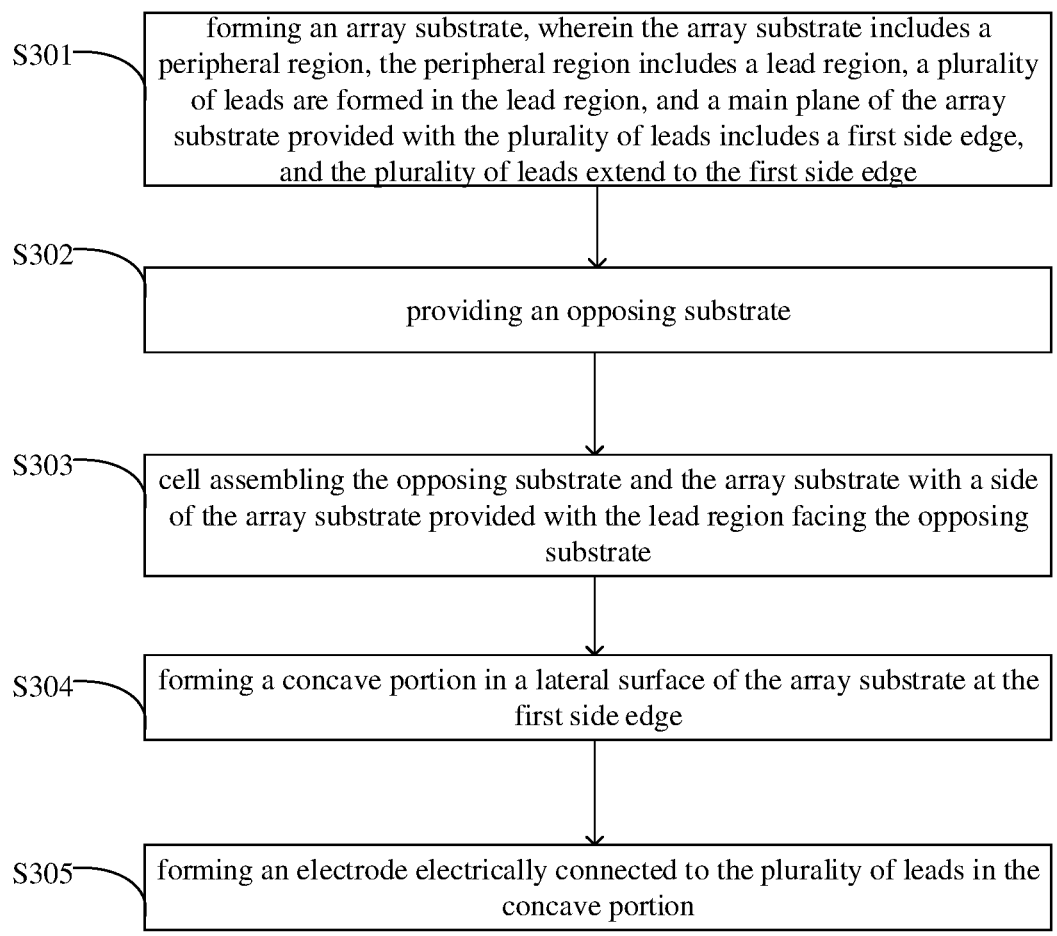
FIG. 8 is a flow chart of a manufacturing method for a display panel provided by another embodiment of the present disclosure.

FIG. 8 is a flow chart of a method of manufacturing a display panel provided by another embodiment of the present disclosure. As shown in FIG. 8, the manufacturing method for the display panel provided in the present embodiment includes the following steps.

S301: forming an array substrate, wherein the array substrate includes a peripheral region, the peripheral region includes a lead region, a plurality of leads are formed in the lead region, and a main plane of the array substrate provided with the plurality of leads includes a first side edge, and the plurality of leads extend to the first side edge.

For example, the array substrate includes a base substrate, and a material of the base substrate can be glass, indium tin oxide, or the like.

S302: providing an opposing substrate.

For example, the opposing substrate may be a color film substrate or a cover glass, and the present embodiment is not limited thereto.

S303: cell assembling the opposing substrate and the array substrate with a side of the array substrate provided with the lead region having the opposing substrate.

For example, the first side edge is flush with a second side edge of the opposing substrate in a direction perpendicular to the main plane of the array substrate. For example, an orthographic projection of the array substrate on a plane parallel to the array substrate and an orthographic projection of the opposing substrate on the plane are completely coincident, that is, an orthographic projection of the first side edge of the array substrate on the plane and an orthographic projection of the second side edge of the opposing substrate on the plane are completely coincident.

For example, in the actual process, the array substrate in the present embodiment is part of a large-size array substrate motherboard, that is, the array substrate motherboard includes a plurality of array substrates; similarly, the opposing substrate in the present embodiment is one of a plurality of opposing substrates included in another large-size opposing substrate motherboard.

For example, upon the display panel to be formed being a liquid crystal display panel and the opposing substrate being a color film substrate, the cell assembly between the opposing substrate and the array substrate refers to the cell assembly between the color film substrate and the array substrate.

For example, the sealant is applied around the color film substrate or the array substrate, a liquid crystal layer is formed between the color film substrate and the array substrate, and the cell assembly of the array substrate and the color film substrate is completed under vacuum. The array substrate motherboard and the color film substrate motherboard are cut to form a plurality of display panels. Upon cutting, the array substrate and the color film substrate are directly subjected to four-side alignment cutting (not limited to four sides, but each side can be aligned cutting) so that the shape and size of the array substrate are exactly the same as those of the color film substrate, that is, the first side edge of the array substrate is aligned with the second side edge of the opposing substrate in a direction perpendicular to the main plane of the array substrate. Because the main plane of the array substrate provided with the lead region formed in the present embodiment does not reserve the position of the bonding region, the first side edge of the array substrate can be flush with the second side edge of the opposing substrate. According to the display panel obtained by cutting in a four-sided alignment cutting mode in the present embodiment, the leads disposed on the side of the array substrate facing the color film substrate can be protected by the array substrate and the color film substrate, and are not easy to be damaged. However, the present embodiment is not limited thereto, and other cutting methods may be adopted.

For example, the display panel to be formed is an organic light emitting diode display panel, and upon the opposing substrate being a cover glass, the cell assembly between the opposing substrate and the array substrate refers that the cover glass is covered on the array substrate.

For example, the main plane (i.e., the front surface) of the array substrate formed in the present embodiment provided with the lead region does not reserve the position of the bonding region, i.e., the bonding process between the array substrate and the subsequent circuit board will be performed on the lateral surface or the back surface of the array substrate.

For example, the main plane of the array substrate formed in the present embodiment provided with the lead region may not reserve a fanout region, that is, the fanout region may be provided on the back surface of the array substrate upon the bonding process between the array substrate and the subsequent circuit board being performed on the back surface of the array substrate.

For example, in a case that the bonding process between the array substrate and the subsequent circuit board is performed on the lateral surface of the array substrate, the fanout region may still be disposed on the main plane of the array substrate.

S304: forming a concave portion in a lateral surface of the array substrate at the first side edge.

For example, after the array substrate and the opposing substrate are cell assembled and cut, laser or plasma etching can be used to etch at the position corresponding to the leads on the lateral surface on which the first side edge of the array substrate is located to form a concave portion.

For example, the formed concave portion may penetrate at least the main plane of the array substrate provided with the leads to form a notch at the first side edge. Before forming the concave portion, a certain preset distance can be set between the plurality of leads and the first side edge. Upon etching the position of the lateral surface of the array substrate including the first side edge corresponding to the plurality of leads in the first direction parallel to the main plane and perpendicular to the first side edge, an etched size of the array substrate is just equal to the preset distance between the plurality of leads and the first side edge, that is, the size of the notch formed on the first lateral surface of the array substrate is just equal to the preset distance in the first direction, thereby ensuring that the plurality of leads can extend to the notch. The present embodiment is not limited thereto, and the concave portion may not penetrate through the main plane of the array substrate.

For example, the concave portion has the features described in any of the embodiments shown in FIG. 2A to FIG. 4B, and will not be described here again.

S305: forming an electrode electrically connected to the plurality of leads in the concave portion.

For example, silver glue, conductive thin film material, etc. are used as electrodes located on the lateral surface of the array substrate in the concave portion.

For example, the electrode formed in the concave portion has the features described in any of the embodiments shown in FIG. 2A to FIG. 4B, and will not be described in detail here.

For example, the method of manufacturing the display panel provided by the present embodiment further includes: disposing a circuit board on a surface of the array substrate away from the opposing substrate or the lateral surface; and electrically connecting the circuit board with the plurality of leads in the concave portion through the electrode.

For example, in an example of the present embodiment, a back electrode electrically connected to the electrode may be formed on the side of the array substrate away from the opposing substrate. This example is not limited to that the back electrode and the electrode are integrated into the same electrode, or the back electrode and the electrode are different electrodes made separately, as long as the back electrode and the leads in the lead region can be electrically connected.

For example, a plurality of bonding electrodes included on the circuit board are respectively electrically connected with a plurality of back electrodes to realize electrical connection between the circuit board and leads. Therefore, in this example, the bonding region on which the circuit board is bonded to the array substrate is located on the side of the array substrate away from the opposing substrate, that is, the back surface of the array substrate. In this example, the bonding region of the array substrate bonded to the circuit board is transferred to the back surface of the array substrate, thus realizing the design of an ultra-narrow frame at periphery.

For example, in another example of the present embodiment, a plurality of bonding electrodes included in the circuit board are directly electrically connected with the electrodes to realize bonding, that is, the bonding region of the array substrate can be the lateral surface on which the electrodes are located, thereby transferring the bonding region of the array substrate bonded with the circuit board to the lateral surface of the array substrate to realize the design of an ultra-narrow frame at periphery.

In the present embodiment, the manufacturing method for forming the concave portion located at the lateral surface of the array substrate after the array substrate and the opposing substrate are cell assembled is low in process difficulty and has no influence on the process before the array substrate and the opposing substrate are cell assembled.

The following statements should be noted:

(1) The accompanying drawings involve only the structure(s) in connection with the embodiment(s) of the present disclosure, and other structure(s) can be referred to common design(s).

(2) In case of no conflict, features in one embodiment or in different embodiments can be combined.

The foregoing is only the embodiments of the present disclosure and not intended to limit the scope of protection of the present disclosure, and the protection scope of the present disclosure should be based on the protection scope of the claims.

What is claimed is:

1. An array substrate, comprising:
a base substrate comprising a peripheral region; and
a lead region located in the peripheral region, the lead region comprising a plurality of leads,
wherein a main plane of the base substrate provided with the plurality of leads comprises a first side edge, and the plurality of leads extend to the first side edge, a lateral surface of the base substrate at the first side edge is provided with a concave portion, an electrode electrically connected with the plurality of leads is disposed in the concave portion, the electrode extends in a direction parallel to the main plane, the lateral surface is connected to the main plane through the first side edge, and a size of the electrode at the first side edge is not greater than a size of the concave portion at the first side edge.

2. The array substrate according to claim 1, wherein, in a first direction parallel to the main plane and perpendicular to the first side edge, a size of the concave portion is 1-10 microns.

3. The array substrate according to claim 1, wherein, in a second direction perpendicular to the main plane, the concave portion penetrates the base substrate to form a notch at the first side edge.

4. The array substrate according to claim 3, wherein, in a first direction parallel to the main plane and perpendicular to the first side edge, a size of the electrode is not greater than a size of the concave portion.

5. The array substrate according to claim 1, wherein, in a second direction perpendicular to the main plane, a size of the concave portion is smaller than a size of the base substrate.

6. The array substrate according to claim 5, wherein, in the second direction, the concave portion extends to the main plane of the base substrate provided with the plurality of leads to form a notch at the first side edge.

7. The array substrate according to claim 5, wherein, in a first direction parallel to the main plane and perpendicular to the first side edge, a size of the electrode is not smaller than the size of the concave portion.

8. The array substrate according to claim 1, wherein the concave portion comprises a plurality of sub-concave portions separated from each other, the plurality of sub-concave portions are disposed in one-to-one correspondence with the plurality of leads, and the electrode in each of the plurality of sub-concave portions is electrically connected to each of the plurality of leads.

9. The array substrate according to claim 1, wherein the concave portion is one integral concave, and the electrode in the concave portion comprises a plurality of sub-electrodes, and each of the sub-electrodes being electrically connected to each of the plurality of leads.

10. The array substrate according to claim 2, wherein, in the first direction, a size of the lead region is 0.07-0.7 mm.

11. The array substrate according to claim 3, wherein the electrode comprises a portion located within the concave portion and another portion located on a surface of the base substrate away from the main plane on which the plurality of leads are located.

12. A display panel, comprising:
the array substrate according to claim 1; and
an opposing substrate, disposed opposite to the array substrate and on a side of the array substrate provided with the lead region.

13. The display panel according to claim 12, further comprising:
a circuit board, disposed on a surface of the base substrate away from the opposing substrate or the lateral surface, and electrically connected to the plurality of leads through the electrode.

14. The display panel according to claim 12, wherein, in a second direction perpendicular to the main plane, a portion of the lateral surface of the base substrate at the first side edge other than the concave portion is located on a same plane as a lateral surface of the opposing substrate.

15. A manufacturing method for a display panel, comprising:
forming an array substrate, wherein the array substrate comprises a peripheral region, the peripheral region comprises a lead region, a plurality of leads are formed in the lead region, and a main plane of the array substrate provided with the plurality of leads comprises a first side edge, and the plurality of leads extend to the first side edge;
providing an opposing substrate;
cell assembling the opposing substrate and the array substrate with a side of the array substrate provided with the lead region facing the opposing substrate;
forming a concave portion in a lateral surface of the array substrate at the first side edge; and
forming an electrode electrically connected to the plurality of leads in the concave portion, wherein the electrode extends in a direction parallel to the main plane, the lateral surface is connected to the main plane through the first side edge, and a size of the electrode at the first side edge is not greater than a size of the concave portion at the first side edge.

16. The manufacturing method according to claim 15, further comprising:
disposing a circuit board on a surface of the array substrate away from the opposing substrate or the lateral surface; and
electrically connecting the circuit board with the plurality of leads through the electrode.

17. The manufacturing method according to claim 15, wherein forming the array substrate comprises: forming an array substrate motherboard;
providing the opposing substrate comprises: providing an opposing substrate motherboard;
cell assembling the opposing substrate and the side of the array substrate provided with the lead region comprises: cell assembling the opposing substrate motherboard and the array substrate motherboard, and cutting the array substrate motherboard and the opposing substrate motherboard to form the array substrate and the opposing substrate, so that the first side edge is flush with a second side edge of the opposing substrate in a direction perpendicular to the main plane of the array substrate.

* * * * *